United States Patent
Strachan et al.

(10) Patent No.: US 9,082,972 B2
(45) Date of Patent: Jul. 14, 2015

(54) BIPOLAR RESISTIVE SWITCH HEAT MITIGATION

(75) Inventors: John Paul Strachan, Millbrae, CA (US); Gilberto Medeiros Ribeiro, Palo Alto, CA (US); Jianhua Yang, Palo Alto, CA (US); Wei Yi, Mountain View, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 461 days.

(21) Appl. No.: 13/557,199

(22) Filed: Jul. 24, 2012

(65) Prior Publication Data

US 2014/0029327 A1    Jan. 30, 2014

(51) Int. Cl.
   *H01L 45/00* (2006.01)
   *G11C 13/00* (2006.01)
   *H01L 47/00* (2006.01)

(52) U.S. Cl.
   CPC .......... *H01L 45/147* (2013.01); *G11C 13/0007* (2013.01); *G11C 13/0069* (2013.01); *H01L 45/04* (2013.01); *H01L 45/08* (2013.01); *H01L 45/128* (2013.01); *H01L 45/1233* (2013.01); *H01L 45/145* (2013.01); *H01L 45/146* (2013.01); *H01L 47/00* (2013.01); *G11C 2013/0073* (2013.01); *G11C 2213/56* (2013.01)

(58) Field of Classification Search
   CPC ....... H01L 27/24; H01L 27/26; H01L 45/128; H01L 45/1286; H01L 45/1293; H01L 47/00
   USPC .......................... 257/2–5, E47.001, E27.004, 257/E45.001–E45.003
   See application file for complete search history.

(56) References Cited

U.S. PATENT DOCUMENTS

| | | |
|---|---|---|
| 5,682,041 A | 10/1997 | Kawakubo et al. |
| 6,118,136 A | 9/2000 | Liu et al. |
| 7,531,850 B2 | 5/2009 | Blanchard |
| 7,601,995 B2 * | 10/2009 | Happ et al. ..................... 257/213 |
| 7,701,758 B2 | 4/2010 | Nakai, et al. |
| 7,936,585 B2 | 5/2011 | Tian et al. |
| 7,961,534 B2 * | 6/2011 | Kang et al. ..................... 365/193 |
| 7,969,771 B2 | 6/2011 | Xi et al. |
| 8,097,537 B2 | 1/2012 | Quick et al. |
| 8,767,449 B2 * | 7/2014 | Pickett et al. ................. 365/159 |
| 2009/0045386 A1 | 2/2009 | Chen |
| 2009/0185412 A1 * | 7/2009 | Peng et al. ..................... 365/163 |
| 2009/0279350 A1 * | 11/2009 | Chen et al. ..................... 365/163 |
| 2011/0063904 A1 | 3/2011 | Chang et al. |

(Continued)

OTHER PUBLICATIONS

Ali Shakouri, "Nanoscale Thermal Transport and Microrefrigerators on a Chip", IEEE, Vo. 94, No. 8, Aug. 2006, pp. 1613-1638.

(Continued)

*Primary Examiner* — Allison P Bernstein
(74) *Attorney, Agent, or Firm* — Hewlett-Packard Patent Department (57) ABSTRACT

A heat mitigated bipolar resistive switch includes a BRS matrix sandwiched between first and second electrodes and a heat mitigator. The BRS matrix is to support bipolar switching of a conduction channel formed between the first and second electrodes through BRS matrix. The heat mitigator is to reduce heat in the BRS matrix generated during bipolar switching. The heat mitigator includes one or both of a parallel-connected NDR element to limit current flowing in the BRS matrix and a high thermal conductivity material to conduct the generated heat away from the BRS matrix above a predetermined elevated temperature.

12 Claims, 4 Drawing Sheets

(56) References Cited

U.S. PATENT DOCUMENTS

| | | |
|---|---|---|
| 2011/0073829 A1 | 3/2011 | Park et al. |
| 2011/0266515 A1 | 11/2011 | Pickett et al. |
| 2011/0310653 A1 | 12/2011 | Kreupl et al. |
| 2012/0051123 A1 | 3/2012 | Liu |

OTHER PUBLICATIONS

Ali Shakouri, et al., "On-Chip Solid-State Cooling for Integrated Circuits Using Thin-Film Microrefrigerators", IEEE, vol. 28, No. 1, Mar. 2005, pp. 65-69.

Liu, X. et al., Diode-less bilayer oxide (WOx—NbOx) device for cross-point resistive memory applications, (Research Paper), Nanotechnology, Nov. 4, 2011, vol. 22, No. 47.

Reifenberg, J.P. et al., Thermal Boundary Resistance Measurements for Phase-change Memory Devices, (Research Paper), IEEE Electron Device Letters, Jan. 2010, pp. 56-58, vol. 31, No.1.

Shiou-Ying Cheng, et al., "Superlatticed negataive differential-resistance heterojunction bipolar transistor", IEEE, vol. 17, No. 4, Jul./Aug. 1999, pp. 1477-1481.

Yan Zhang, et al., "Enhanced Hot Spot Cooling Using Bonded Superlattice Microcoolers With a Trench Structure", IEEE, vol. 31, No. 3, Sep. 2008, pp. 552-558.

Yan Zhang, et al., "On-Chip High Speed Localized Cooling Using Superlattice Microrefrigerators", IEEE, vol. 29, No. 2, Jun. 2006, pp. 395-401.

\* cited by examiner

BIPOLAR RESISTIVE SWITCH HEAT MITIGATION

CROSS-REFERENCE TO RELATED APPLICATIONS

N/A

STATEMENT REGARDING FEDERALLY SPONSORED RESEARCH OR DEVELOPMENT

N/A

BACKGROUND

A bipolar resistive switch, also often referred to as a 'memristor,' is an electrical device having or exhibiting an instantaneous resistance state that is a function substantially of bias history. In particular, a bias (e.g., a voltage or a current) applied across terminals of the bipolar resistive switch may be used to set, select or program a device state (e.g., a resistance) of the bipolar resistive switch. Once programmed, the bipolar resistive switch may retain the device state for a specified period of time after the bias is removed. As such, a bipolar resistive switch is a two-terminal device that may function as a non-volatile memory where the programmed device state stores information.

In some examples, the bipolar resistive switch or memristor may be switched between a specific pair of device states using a programming signal having two different polarities (e.g., a positive voltage and a negative voltage). For example, the bipolar resistive switch may be switched to a first or 'ON' device state (e.g., a relatively low resistance state) by a first polarity of the programming signal. Alternatively, the bipolar resistive switch may be switched to a second or 'OFF' device state (e.g., a relatively high resistance state) by a second polarity of the programming signal. Such 'bipolar switching' may be used to implement a binary memory cell or element, for example. Further, a plurality of bipolar resistive switches may be arranged in an array (e.g. a cross-bar array) to serve as a binary memory for storing data in a computer system or as programmable logic, according to various applications.

BRIEF DESCRIPTION OF THE DRAWINGS

Various features of examples in accordance with the principles described herein may be more readily understood with reference to the following detailed description taken in conjunction with the accompanying drawings, where like reference numerals designate like structural elements, and in which.

Certain examples have other features that are one of in addition to and in lieu of the features illustrated in the above-referenced figures. These and other features are detailed below with reference to the above-referenced figures.

DETAILED DESCRIPTION

Examples in accordance with the principles described herein provide heat mitigation in bipolar resistive switching. In particular, heat mitigation to one or both of limit heat production in and remove heat (e.g., extra or excessive heat) from the bipolar resistive switching memristor is provided, according to various examples. Heat mitigation according to the principles described herein may facilitate bipolar switching while concurrently reducing or substantially eliminating unipolar switching effects (e.g., switching that is substantially independent of bias polarity) in a bipolar resistive switch, for example. Heat mitigation in bipolar resistive switching may be particularly important in large-scale memory systems that employ bipolar resistive switching for data storage, for example.

Figure 1:
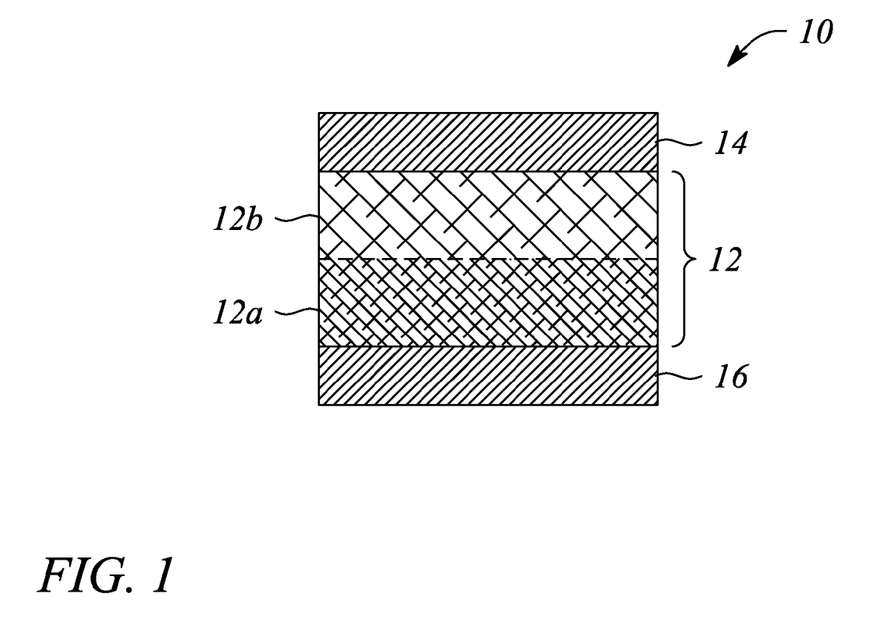
FIG. 1 illustrates a cross sectional view of a bipolar resistive switch, according to an example consistent with the principles described herein.

FIG. 1 illustrates a cross sectional view of a bipolar resistive switch 10, according to an example consistent with the principles described herein. As illustrated, the bipolar resistive switch 10 is a two terminal device comprising a layer 12 of a bipolar resistive switching (BRS) material, also referred to as a BRS matrix, herein. The BRS material is a material exhibits a BRS phenomenon or characteristic when subjected to a stimulus (e.g., a voltage or a current), by definition herein. The BRS matrix layer 12 is disposed or 'sandwiched' between a first or 'top' electrode 14 and a second or 'bottom' electrode 16. The first and second electrodes 14, 16 facilitate applying the stimulus or 'programming signal' to affect a change in the BRS matrix layer 12.

In various examples, the BRS matrix layer 12 of the bipolar resistive switch 10 may comprise any of a variety of oxides and nitrides that can be formed into a layer between a pair of electrodes. For example, titanium oxide ($TiO_2$) may be used as the oxide layer in a bipolar resistive switch. Other oxides that may be employed include, but are not limited to, hafnium oxide, nickel oxide, nickel oxide doped with chromium, strontium titanate, chromium doped strontium titanate, and tungsten oxide, for example. Nitrides uses as a nitride layer of a bipolar resistive switch include, but are not limited to aluminum nitride and silicon nitride.

In some examples, the BRS matrix layer 12 may comprise a crystalline oxide (e.g., an oxide layer). In other examples, the BRS matrix layer 12 may comprise a crystalline nitride (e.g., a nitride layer). In some of these examples, the crystalline oxide or nitride may be mono-crystalline. In other examples, the BRS matrix layer 12 comprises an amorphous oxide or nitride. In yet other examples, the BRS matrix layer 12 comprises either a nanocrystalline oxide or a microcrystalline oxide or nitride. A nanocrystalline oxide or nitride is an oxide or nitride that includes or comprises a plurality of nanoscale crystallites while a microcrystalline oxide or nitride may include crystallites having sizes in the micron range, for example.

In some examples, the BRS matrix layer 12 may comprise a plurality of layers. A first layer of the plurality may be a stoichiometric oxide (e.g., $TiO_2$, $HfO_2$, etc.) while a second layer may be an oxygen depleted or oxygen deficient oxide layer (e.g., $TiO_{2-x}$, $HfO_{2-x}$, etc.) where '2-x' denotes an oxygen deficiency, and where x is greater than 0 and less than about 2). For example, the oxygen deficient $TiO_{2-x}$ may have values of x that are greater than about $10^{-5}$ and less than about $10^{-2}$. In another example, the oxygen deficient $TiO_{2-x}$ may have a value of x that ranges up to about 1.0. Similarly, a first layer of the plurality of layers of the BRS matrix layer 12 may be a stoichiometric nitride (e.g., AlN, $Si_3N_4$, etc.) while a second layer may be a nitrogen depleted or nitrogen deficient nitride layer (e.g., $AlN_{1-x}$, $Si_3N_{4-x}$, etc.). In some examples, these oxygen deficient or nitrogen deficient layer may be referred to as 'suboxides' or 'subnitrides', respectively.

According to some examples, the change in the BRS matrix layer 12 produced by the programming signal may be understood in terms of oxygen (or nitrogen) migration within the BRS matrix layer 12, according to some embodiments. For example, a boundary between a layer of BRS matrix material 12b that is deficient in oxygen/nitrogen (e.g., the suboxide/subnitride layer) and another effectively stoichiometric BRS matrix material layer 12a (i.e., oxide/nitride that is not oxygen/nitride deficient) may move as a result of exposure to the programming signal. The movement of the boundary may result from oxygen or nitrogen migration under the influence of the programming signal, for example. A final location of the movable boundary may establish the 'programmed' resistance of the bipolar resistive switch 10, for example. Alternatively, the change in the BRS matrix layer 12 may also be understood in terms of a formation of current filaments, according to some examples. In either case, a conduction channel may be formed by the programming signal that results in a change in a resistance of the BRS matrix layer 12 as measured between the first and second electrodes 14, 16.

The first and second electrodes 14, 16 comprise a conductor. For example, the first electrode 14 and the second electrode 16 may comprise a conductive metal. The conductive metal used for the first and second electrodes 14, 16 may include, but is not limited to, gold (Au), silver (Ag), copper (Cu), aluminum (Al), palladium (Pd), platinum (Pt), tungsten (W), vanadium (V), tantalum (Ta), and titanium (Ti) as well as alloys thereof, for example. Other conductive metals and other conductive materials (e.g., a highly doped semiconductor, conductive oxides, conductive nitrides, etc.) may also be employed as the first electrode 14 and the second electrode 16, according to various examples. Moreover, the conductive material need not be the same in the first and second electrodes 14, 16.

Additionally, the first and second electrodes 14, 16 may comprise more than one layer. For example, a layer of Ti may be employed between a Pt-based electrode and a $TiO_2$ based BRS matrix layer 12. The Ti layer may assist in providing an oxygen deficient layer (i.e., $TiO_{2-x}$) in the $TiO_2$ oxide BRS matrix layer 12, for example. In still other examples, materials used in the electrodes 14, 16 may act as a diffusion barrier. For example, titanium nitride (TiN) may be employed as a diffusion barrier.

In some examples, a conductive material of one or both of the first and second electrodes 14, 16 may comprise a metallic form of a metal oxide used as the BRS matrix layer 12. For example, a Ti electrode 14, 16 may be employed when the BRS matrix layer 12 comprises $TiO_2$. Similarly, one or both of the electrodes 14, 16 may comprise Ta when the BRS matrix layer 12 comprises $Ta_2O_5$. In yet other examples, a refractory material such as tungsten may be used for the electrode(s) 14, 16.

According to various examples, the bipolar resistive switch 10 provides data storage of a bit of data in the form of a plurality of resistance states. In particular, the data bit may be stored in a non-volatile manner by the bipolar resistive switch 10 by selecting and setting or programming a particular one of at least two of the resistance states (i.e., device states) of the plurality, according to some examples. For example, selecting and setting a first resistive state may be used to store a data bit representing a logic '1' while selecting and setting a second resistance state may be used to store a data bit representing a logic '0'.

The bipolar resistive switch 10 may be programmed or set by passing a current through the bipolar resistive switch 10, according to various examples. In particular, a particular resistance state of the at least two resistance states may be programmed or set by application of an external signal (e.g., programming signal). For example, the external signal may comprise an applied voltage that induces the current through the bipolar resistive switch. A polarity of the applied voltage, in turn, determines a direction of the current. The current direction then determines which of the at least two resistance states is selected. Hence, 'bipolar switching' is defined herein as switching between resistive states of the bipolar resistive switch using a bipolar programming signal (e.g., the applied voltage having two different polarities). Similarly, a 'bipolar resistive switch' is defined herein as a resistive switch that may be programmed or set in a selected one of at least two resistive states through bipolar switching, by definition herein. For example, a first resistive state may be set by application of a programming signal having a first polarity (e.g., a positive voltage) while a second resistive state may be set by application of a programming signal having a second polarity (e.g., a negative voltage). By extension, a BRS material is defined as a material layer of the bipolar resistive switch that facilitates or enables bipolar resistive switching.

On the other hand, 'unipolar switching' is switching of a resistive switch that occurs regardless of or substantially independent of a polarity of a programming signal, by definition herein. In particular, unipolar switching has substantially no bias polarity dependence and may be driven by heating or temperature, for example. In some examples, unipolar switching may result in a state change of a device that interferes with or even substantially opposes a state change of the bipolar switching.

For example, unipolar switching may be due to heating of the resistive switch. Heating may be independent of a direction of the current flowing in the resistive switch, for example. Unipolar switching may occur in a bipolar resistive switch, according to some examples. For example, as a bipolar resistive switch is cycled between resistive states, the induced current flowing through the BRS matrix 12 generates heat within the bipolar resistive switch 10. The heat generated is substantially independent of the polarity of a programming signal. Instead, the generated heat is largely related to combination of a duty cycle and a switching rate of the programming signal. As such, unipolar switching due to heat may interfere with bipolar switching in the bipolar resistive switch, according to some examples. Heat mitigation according to various examples of the principles described herein may reduce or substantially eliminate unipolar switching in bipolar resistive switches, for example.

Herein, a negative differential resistance material is defined as a material having negative differential resistance. Negative differential resistance (NDR) is defined as a negative voltage-current relationship in a device occurring over at least a portion of an operational current-voltage range of the device. In particular, NDR is characterized by an increase in current flowing through a device as voltage across the device is decreased. In contrast, a non-NDR device such as an 'ohmic' or conventional resistive device exhibit a positive voltage-current relationship, by definition herein. Namely, as the voltage across the device increases, current flowing through the device also increases. An NDR material, and by direct extension, an NDR device or element within a device may be further characterized as being either S-NDR or N-NDR based on a general shape and orientation of the NDR voltage-current relationship. S-NDR is sometimes also referred to as current-controlled NDR (CC-NDR) while N-NDR is sometimes also referred to as voltage-controlled NDR (VC-NDR).

Figure 2A:
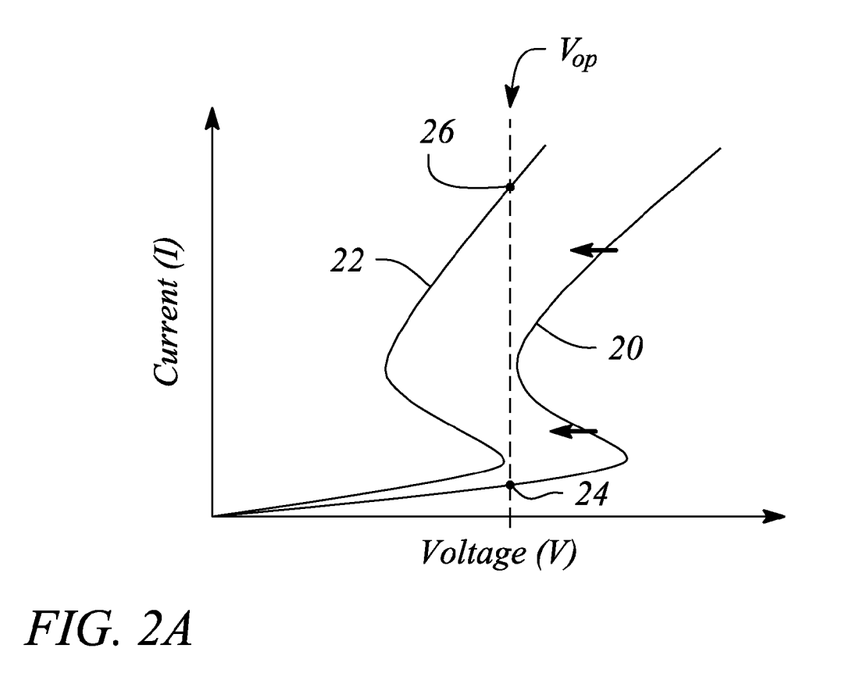
FIG. 2A illustrates a graph of an S-NDR current-voltage (I-V) relationship, according to an example consistent with the principles described herein.
Figure 2B:
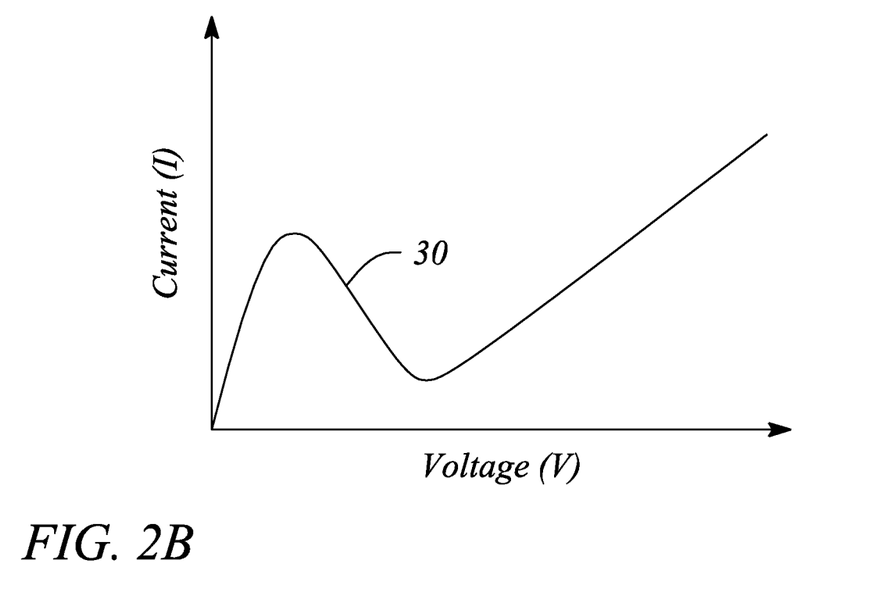
FIG. 2B illustrates a graph of an N-NDR current-voltage (I-V) relationship, according to an example consistent with the principles described herein.

FIG. 2A illustrates a graph of an S-NDR current-voltage (I-V) relationship or curve, according to an example consistent with the principles described herein. FIG. 2B illustrates a graph of an N-NDR current-voltage (I-V) relationship or curve, according to an example consistent with the principles described herein. As is illustrated in FIGS. 2A and 2B, the S-NDR I-V curve 20 is generally S-shaped while the N-NDR I-V curve 30 is N-shaped, in general. By definition herein, one or more of a material, a device and an element that exhibits or is characterized by an S-NDR I-V relationship is an S-NDR material, an S-NDR device or an S-NDR element, respectively. Also by definition herein, one or more of a material, a device and an element that exhibits or is characterized by an N-NDR I-V relationship is an N-NDR material, an N-NDR device or an N-NDR element, respectively.

Both S-NDR devices or elements and N-NDR devices or elements may exhibit an NDR I-V relationship that varies as a function of temperature. For example, as illustrated in FIG. 2A, the NDR I-V curve 20 of an S-NDR element may shift to the left (e.g., as indicated by heavy arrow) as depicted by the NDR I-V curve 22 as temperature increases. In particular, the NDR I-V curve 20 may characterize the S-NDR element at a first temperature $T_1$ while the NDR I-V curve 22 may characterize the S-NDR element at a second temperature $T_2$, where $T_2$ is greater than $T_1$, for example. As such, for a particular operating voltage $V_{op}$ across the S-NDR element, a resistance of the S-NDR element is either a first resistance $R_{high}$ (e.g., a high resistance) at relatively lower temperatures or a second resistance $R_{low}$ (e.g., a low resistance) at temperatures above a predetermined elevated temperature as a result of the temperature dependence, as illustrated in FIG. 2A. Specifically, FIG. 2A illustrates a first operating point 24 of the S-NDR element established by the operating voltage $V_{op}$ at temperature $T_1$ and a second operating point 26 established by the operating voltage $V_{op}$ at temperature $T_2$. At the first operating point 24 the S-NDR element exhibits the first resistance $R_{high}$ while at the second operating point 26 the S-NDR element exhibits the second resistance $R_{high}$ due to the temperature-dependent shift in the NDR I-V curves 20, 22, of the S-NDR element, as illustrated.

Further, as used herein, the article 'a' is intended to have its ordinary meaning in the patent arts, namely 'one or more'. For example, 'a switch' means one or more switches and as such, 'the switch' means 'the switch(es)' herein. Also, any reference herein to 'top', 'bottom', 'upper', 'lower', 'up', 'down', 'front', back', 'left' or 'right' is not intended to be a limitation herein. Herein, the term 'about' when applied to a value generally means within the tolerance range of the equipment used to produce the value, or in some examples, means plus or minus 10%, or plus or minus 5%, or plus or minus 1%, unless otherwise expressly specified. Moreover, examples herein are intended to be illustrative only and are presented for discussion purposes and not by way of limitation.

Figure 3:
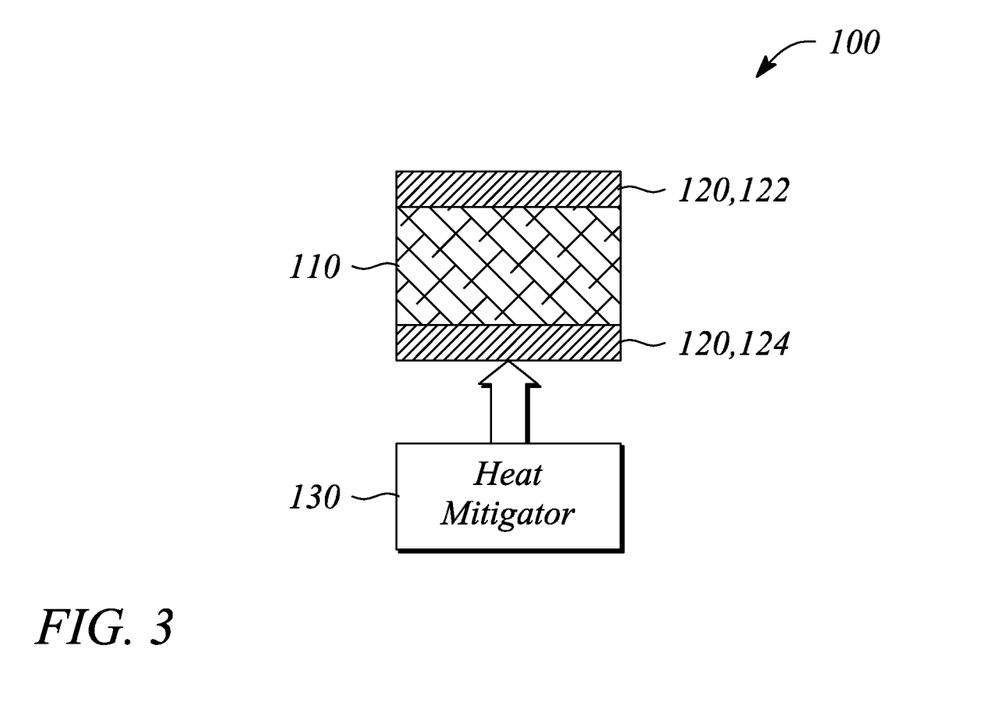
FIG. 3 illustrates a block diagram of a heat mitigated bipolar resistive switch, according to an example consistent with the principles described herein.

FIG. 3 illustrates a block diagram of a heat mitigated bipolar resistive switch 100, according to an example consistent with the principles described herein. As illustrated, the heat mitigated bipolar resistive switch 100 with heat mitigation comprises a bipolar resistive switching (BRS) matrix 110 sandwiched between a pair of electrodes 120. The BRS matrix 110 is configured to support a conduction channel formed from a first electrode 122 to a second electrode 124 of the electrode pair 120. In particular, the conduction channel is formed through the BRS matrix 110. A resistance associated with the conduction channel establishes a resistive state of the heat mitigated bipolar resistive switch 100, according to various examples.

According to some examples, the BRS matrix 110 may comprise a transition metal oxide (TMO). The TMO may comprise a material selected from tantalum oxide (e.g., $Ta_2O_5$), hafnium oxide (e.g., $HfO_2$) and titanium oxide (e.g., $TiO_2$), for example. Other materials that may be used in the BRS matrix 110 include, but are not limited to, oxides of vanadium (V), manganese (Mn), molybdenum (Mo), niobium (Nb), tungsten (W), chromium (Cr), zirconium (Zr), scandium (Sc), yttrium (Y), lanthanum (La), rhenium (Re), technetium (Tc) as well as various other metal insulator transition (MIT) materials. The conduction channel in the BRS matrix 110 may comprise a suboxide of the BRS matrix material. For example, the conduction channel in a $Ta_2O_5$ based BRS matrix 110 may comprise a suboxide $Ta_2O_{5-x}$, the conduction channel in a $HfO_2$ based BRS matrix 110 may comprise a suboxide $HfO_{2-x}$, the conduction channel in a $TiO_2$ based BRS matrix 110 may comprise $TiO_{2-x}$ and so on. In other examples, the BRS matrix 110 may comprise a metallic nitride such as, but not limited to, aluminum nitride (AlN), silicon nitride ($Si_3N_4$), gallium nitride (GaN), and so on. In turn, the conduction channel may, for example, comprise a subnitride of the BRS matrix material such as, but not limited to, $AlN_{1-x}$, $Si_3N_{1-x}$, and $GaN_{1-x}$, respectively. The electrodes 120 may comprise a metal such as, but not limited to, copper (Cu), silver (Ag), gold (Au), platinum (Pt), tantalum (Ta), tungsten (W), titanium (Ti), and aluminum (Al), a metallic oxide such as, but not limited to, rubidium oxide ($RuO_2$), iridium oxide ($IrO_2$), and a metallic nitride such as, but not limited to, titanium nitride (TiN), tantalum nitride (TaN), and tungsten nitride (WN), according to various examples. Other higher than binary oxides or nitrides, such as, but not limited to, $SrTiO_3$ (STO), $PrCaMnO_3$ (PCMO), $LaCaMnO_3$ (LCMO) may also be used, according to some examples.

As illustrated in FIG. 3, the heat mitigated bipolar resistive switch 100 further comprises a heat mitigator 130. The heat mitigator 130 is configured to reduce heat in the BRS matrix 130 generated during bipolar switching. Bipolar switching may be associated with setting or programming the bipolar resistive switch 100, for example. In some examples, the heat mitigator 130 is configured to reduce the generated heat by limiting a current flowing in the BRS matrix 110. In other examples, the heat mitigator 130 is configured to reduce the generated heat by preferentially conducting the generated heat away from the BRS matrix 110. In yet other examples, the heat mitigator 130 is configured to both limit the current in the BRS matrix and preferentially conduct the generated heat away from the BRS matrix 110. One or both of the current limiting and preferential conducting away of the generated heat provided by the heat mitigator 130 is provided as a function of temperature.

In some examples, the heat mitigator 130 comprises a high thermal conductivity material configured to conduct the generated heat away from the BRS matrix 110. In particular, the heat mitigator 130 comprises material adjacent to and in thermal connection or contact with the BRS matrix 110 that is a high thermal conductivity material. For example, various structures adjacent to the BRS matrix 110 such as, but not limited to, the electrodes, an interlayer dielectric (ILD), and a supporting substrate may comprise the high thermal conductivity material. The thermal connection provides a path for heat to be preferentially conducted away from the BRS matrix 110 through the adjacent material to reduce the heat, according to various examples. The heat generated in the BRS matrix may be conducted away to a heat sink, for example.

The high thermal conductivity material may be any material that is classified as a 'good' thermal conductor. In some examples, a good thermal conductor is one that has a thermal conductivity that is equal to or greater than a thermal conductivity of a material of the BRS matrix 110. In particular, by definition herein, a high thermal conductivity material is a material having a thermal conductivity that is higher and in some examples, much higher than about 10 watts per meter per degrees kelvin ($Wm^{-1}K^{-1}$). For example, the high thermal conductivity material may have a thermal conductivity that is greater than about 15-20 $Wm^{-1}K^{-1}$. In some examples, the thermal conductivity of the high thermal conductivity material may be greater than about 50-100 $Wm^{-1}K^{-1}$.

Examples of materials that may be employed as the high thermal conductivity material of the heat mitigator 130 include, but are not limited to, alumina ($Al_2O_3$), aluminum nitride (AlN), beryllia (BeO), diamond, silicon carbide (SiC), and boron nitride (BN) and other generally electrically insulating compounds. Additionally, both electrically and thermally conductive materials represented by a variety of metals, metallic oxides and metallic nitrides such as, but not limited to, those listed above for the electrodes 120, may be used as the high thermal conductivity material of the heat mitigator 130, in some examples. In contrast, materials that exhibit a thermal conductivity that is less than and in some examples, much less than about 10 $Wm^{-1}K^{-1}$ are not high thermal conductivity materials, by definition herein. Silicon dioxide ($SiO_2$) having a thermal conductivity of about 1-2.5 $Wm^{-1}K^{-1}$ as a ceramic and about 0.59-1.8 $Wm^{-1}K^{-1}$ as a glass is an example of a material that is not a high thermal conductivity material, by definition herein.

Figure 4:
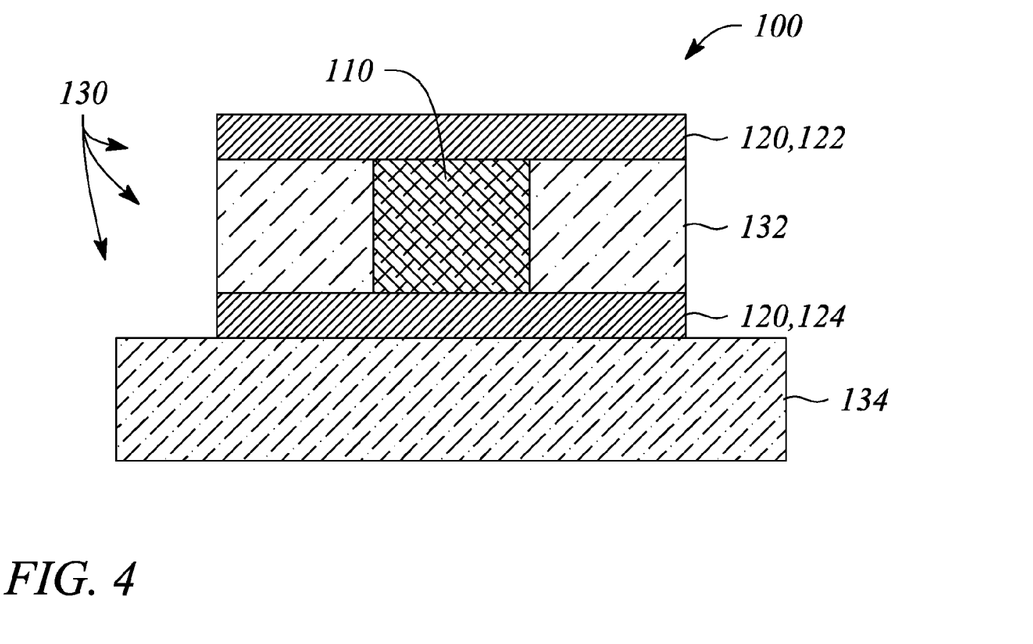
FIG. 4 illustrates a cross sectional view of a heat mitigated bipolar resistive switch, according to an example consistent with the principles described herein.

FIG. 4 illustrates a cross sectional view of a heat mitigated bipolar resistive switch 100, according to an example consistent with the principles described herein. As illustrated, the heat mitigated bipolar resistive switch 100 comprises the BRS matrix 110 sandwiched between the pair of electrodes 120. The pair of electrodes 120 includes the first electrode 122 (e.g., illustrated as a 'top' electrode) and the second electrode 124 (illustrated as a 'bottom' electrode). Further illustrated in FIG. 4 are an interlayer dielectric (ILD) 132 and a substrate 134. The ILD 132 is adjacent to and in intimate physical contact with the BRS matrix 110, according to various examples. For example, the ILD 132 may substantially surround the BRS matrix 110. In addition, the ILD 132 and the substrate 134 are separate, electrically insulating structures, according to various examples.

As illustrated, the heat mitigator 130 may comprise one or more of the pair of electrodes 120, the ILD 132 and the substrate 134, as illustrated. For example, one or both of the ILD 132 and the substrate 134 may comprise a high thermal conductive material such as a material selected from, but not limited to, one or more of alumina, aluminum nitride, beryllia, silicon carbide and diamond. Further, the electrodes 120 may comprise a metal, a metal oxide, or a metal nitride, for example, which acts as, or have the characteristic or property of, a high thermal conductive material, for example. A thermal conduction path may be provided from the BRS matrix 110 through the ILD 132, the second electrode 124, and out to the substrate 134, according to some examples. The thermal conduction path may allow heat to be reduced in the BRS matrix 110, for example. Hence, the combination of the ILD 132, the second electrode 124 and the substrate 134 serve as the heat mitigator 130, by way of example, as illustrated.

In some examples, the heat mitigator 130 comprises a negative differential resistance (NDR) element. The NDR element is configured to limit the current flowing in the BRS matrix 110 above a predetermined elevated temperature of the BRS matrix 110, according to various examples. In particular, the NDR element may comprise an S-NDR material, in some examples. In these examples, the heat mitigator 130 comprises the S-NDR element connected in parallel with the conduction channel of the BRS matrix 110. The parallel arrangement of the S-NDR based NDR element and the conduction channel provide a shunt current path that bypasses the BRS matrix 110 as a function of temperature, according to various examples.

For example, the S-NDR material will exhibit a change in resistance (e.g., a change from a high resistance to a low resistance) above the predetermined elevated temperature allowing current to be shunted through the NDR element instead of through (i.e., around) the BRS matrix 110. Shunting current through the NDR element leads to a reduction in an amount of current flowing in the conduction channel of the BRS matrix 110 and may result in an overall reduction in the heat generated within the BRS matrix 110 above the predetermined elevated temperature, for example. According to some examples, the S-NDR material may comprise one or more of vanadium oxide ($VO_2$), niobium oxide ($NbO_2$), a titanium oxide (e.g., $Ti_2O_3$, $Ti_3O_5$, etc.), and manganese oxide (MnO). In other examples, other materials that exhibit an S-NDR characteristic may be employed as the S-NDR material.

Figure 5:
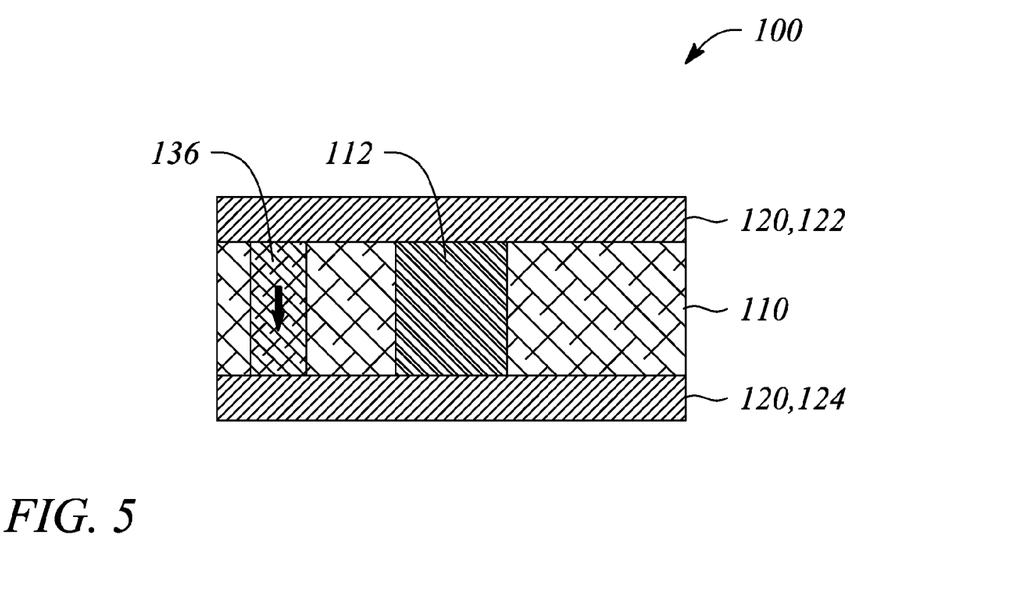
FIG. 5 illustrates a cross sectional view of a heat mitigated bipolar resistive switch, according to another example consistent with the principles described herein.

FIG. 5 illustrates a cross sectional view of a heat mitigated bipolar resistive switch 100, according to another example consistent with the principles described herein. In particular, the heat mitigated bipolar resistive switch 100 comprises the BRS matrix 110 sandwiched between the pair of electrodes 120, as illustrated. The pair of electrodes 120 includes the first or top electrode 122 and the second or bottom electrode 124. A conduction channel 112 is illustrated within the BRS matrix 110, by way of example. Further illustrated in FIG. 5 is the NDR element 136 connected in parallel with the conduction channel. As illustrated, the parallel-connected NDR element 136 is connected between the top electrode 122 and the bottom electrode 124 to provide the shunt current path above the predetermined elevated temperature as illustrate by the arrow in FIG. 5. Moreover, the parallel-connected NDR element 136 is located within the BRS matrix 110, as illustrated in FIG. 5. For example, the BRS matrix 110 may comprise $TiO_2$ and the conduction channel may comprise $TiO_{2-x}$ while the NDR element 136 may comprise $Ti_2O_3$. In other examples (not illustrated), the parallel-connected NDR element 136 may be located outside of the BRS matrix 110, for example in an interlayer dielectric (ILD) surrounding the BRS matrix 110.

In other examples (not illustrated), the current limiting characteristic of the heat mitigator 130 may be provided by another means. For example, the heat mitigator 130 may comprise a thermistor connected in parallel with the BRS matrix 110. The parallel-connected thermistor may shunt current in a manner that is analogous to the parallel-connected NDR element 136. In particular, the thermistor may preferentially conduct more current at a temperature above the predetermined elevated temperature to reduce the current flowing in the BRS matrix 110, for example.

Figure 6:
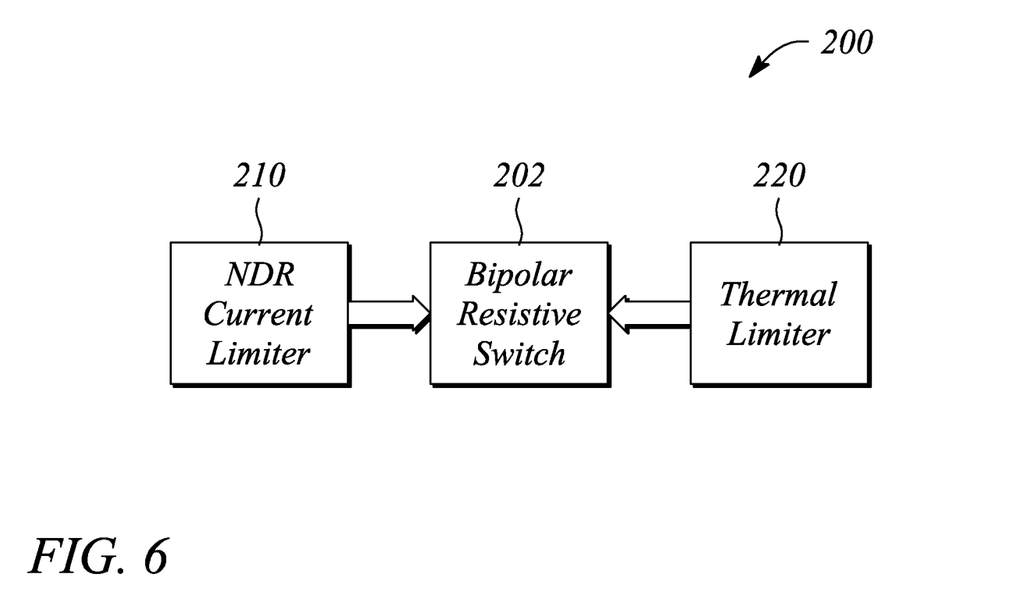
FIG. 6 illustrates a block diagram of a bipolar resistive switch heat mitigation system, according to an example consistent with the principles described herein.

FIG. 6 illustrates a block diagram of a bipolar resistive switch heat mitigation system 200, according to an example consistent with the principles described herein. The bipolar resistive switch mitigation system 200 is configured to mitigate (i.e., reduce) an effect of heat in a bipolar resistive switch 202. In particular, the heat mitigation provided by the bipolar resistive switch heat mitigation system 200 facilitates predominance of a bipolar switching characteristic over a unipolar switching characteristic of the bipolar resistive switch 202, according to various examples.

As illustrated, the bipolar resistive switch heat mitigation system 200 comprises one or both of a parallel-connected negative differential resistance (NDR) current limiter 210 and a thermal limiter 220. The parallel-connected NDR current limiter 210 is configured to limit a switching current that flows in the bipolar resistive switch 202. According to some examples, the switching current is limited at a temperature above a predetermined elevated temperature. The thermal limiter 220 is configured to remove heat generated in the bipolar resistive switch 202 by the switching current. In various examples, the current limiter 210 and the thermal limiter 220 are to mitigate an effect of heat in the bipolar resistive switch element.

According to various examples, the bipolar resistive switch 202 is configured to provide bipolar switching between a pair of conduction states, according to various examples. In particular, the bipolar resistive switch 202 may be substantially similar to a combination of the BSR matrix 110 sandwiched between the pair of electrodes 120, described above with respect to the heat mitigated bipolar resistive switch 100. For example, the bipolar resistive switch 202 may have a conduction channel between a bottom electrode and a top electrode through a bipolar resistive switching (BRS) matrix. Changes induced in the conduction channel in the BRS matrix may provide switching between the pair of conduction states (or equivalently a pair of resistance states), for example.

According to some examples, the parallel-connected NDR current limiter 210 comprises an S-NDR element connected in parallel with a conduction channel in the bipolar resistive switch 202. The S-NDR element comprises an S-NDR material and in some examples, may be substantially similar to the parallel-connected NDR element 136 (e.g., as illustrated in FIG. 5), described above with respect to the heat mitigated bipolar resistive switch 100.

According to some examples, the thermal limiter 220 comprises a high thermal conductive material to provide thermal conduction of the generated heat away from a conduction channel of the bipolar resistive switch 202. In some examples, the thermal limiter 220 may be substantially similar to the heat mitigator 130 (e.g., illustrated in FIG. 4) comprising high thermal conductive material described above with respect to the heat mitigated bipolar resistive switch 100. In particular, one or more of electrodes of the bipolar resistive switch 202, an interlayer dielectric (ILD) adjacent to and in thermal contact with the BRS matrix, and a substrate may comprise the high thermal conductive material, for example.

Figure 7:
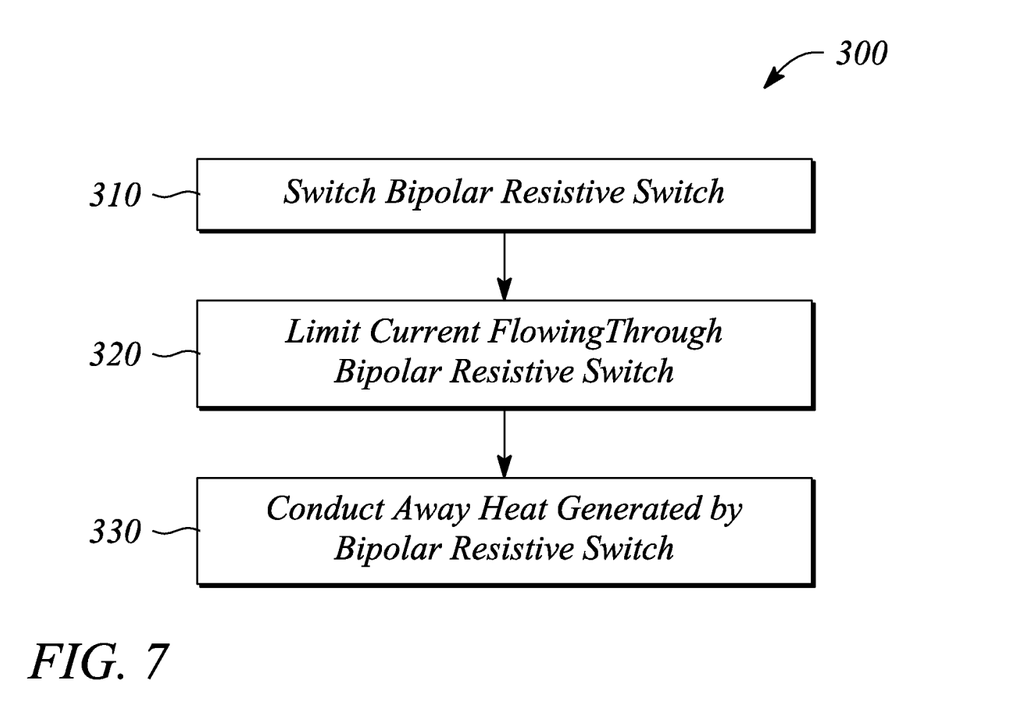
FIG. 7 illustrates a flow chart of a method of heat mitigation in bipolar resistive switching, according to an example consistent with the principles described herein.

FIG. 7 illustrates a flow chart of a method 300 of heat mitigation in bipolar resistive switching, according to an example consistent with the principles described herein. As illustrated, the method 300 of bipolar resistive switching heat mitigation comprises switching 310 a bipolar resistive switch between a first resistive state and a second resistive state. Switching 310 the bipolar resistive switch may be provided by applying a voltage across terminals of the bipolar resistive switch to induce a switching current to flow through the bipolar resistive switch. A polarity of the applied voltage and equivalently, a direction of the current flow, determine which of the first and second resistive states is set or programmed into the bipolar resistive switch, according to various examples.

According to various examples, the bipolar resistive switch may be substantially similar to the bipolar resistive switch 202 described above with respect to the bipolar resistive switch heat mitigation system 200. In particular, the bipolar resistive switch may comprise a bipolar resistive switching (BRS) matrix sandwiched between a pair of electrodes. The BRS matrix may be substantially similar to the BRS matrix 110, described above with respect to the heat mitigated bipolar resistive switch 100, for example. Likewise for example, the pair of electrodes may be substantially similar to the pair of electrodes 120 described above with respect to the heat mitigated bipolar resistive switch 100.

According to some examples, the method 300 of heat mitigation in bipolar resistive switching further comprises limiting current 320 flowing through the bipolar resistive switch as a function of temperature. In some examples, limiting current 320 uses a negative differential resistance (NDR) to substantially reduce current flowing through the bipolar resistive switch at a temperature above a predetermined elevated temperature. In particular, the NDR may be provided by an S-NDR element connected in parallel with a conduction path of the bipolar resistive switch, in some examples. The parallel-connected S-NDR element is configured to shunt current away from or 'around' the conduction path at temperatures above the predetermined elevated temperature, for example. In some examples, the parallel-connected S-NDR element may be substantially similar to the parallel-connected S-NDR element 136 of the heat mitigated bipolar resistive switch 100, described above.

According to some examples, the method 300 of heat mitigation in bipolar resistive switching further comprises conducting away 330 heat generated by the bipolar resistive switch using a material having high thermal conductivity in contact with the bipolar resistive switch. Conducting away 330 heat is performed as a function of temperature (e.g., above the predetermined elevated temperature), according to various examples. In some examples, the high thermal conductive material comprising a material of one or both of an interlayer dielectric layer (ILD) adjacent to BRS matrix of the bipolar resistive switch, and a substrate that supports the bipolar resistive switch. In particular, conducting away 330 heat may be accomplished using a heat mitigator substantially similar to the heat mitigator 130 comprising a high thermal conductivity, described above with respect to the heat mitigated bipolar resistive switch 100, according to some examples. In some examples, the method 300 of heat mitigation may be performed by the heat mitigation system 200 described above.

Thus, there have been described examples of a heat mitigated bipolar resistive switch, a bipolar resistive switch heat mitigation system, and a method of heat mitigation in bipolar resistive switching. It should be understood that the above-described examples are merely illustrative of some of the many specific examples that represent the principles described herein. Clearly, those skilled in the art can readily devise numerous other arrangements without departing from the scope as defined by the following claims.

What is claimed is:

1. A heat mitigated bipolar resistive switch comprising:
a bipolar resistive switching (BRS) matrix sandwiched between a first electrode and a second electrode, the BRS matrix to support bipolar switching of a conduction channel formed between the first and second electrodes through BRS matrix; and
a heat mitigator to reduce heat in the BRS matrix generated during the bipolar switching, the heat mitigator comprising one or both of a parallel-connected NDR element to limit current flowing in the BRS matrix and a high thermal conductivity material to conduct the generated heat away from the BRS matrix above a predetermined elevated temperature,
wherein the parallel-connected NDR element comprises an S-NDR material, the parallel-connected NDR element being connected in parallel with the conduction channel of the BRS matrix between the first and second electrodes to provide a shunt current path that bypasses the BRS matrix.

2. The heat mitigated bipolar resistive switch of claim 1, further comprising a substrate to support the first and second electrodes and the BRS matrix and an interlayer dielectric adjacent to the BRS matrix, wherein one or more of the interlayer dielectric and the substrate comprises the high thermal conductivity material.

3. The heat mitigated bipolar resistive switch of claim 2, wherein one or both of the ILD and the substrate comprises a material selected from alumina, aluminum nitride, beryllia, diamond, silicon carbide, and boron nitride.

4. The heat mitigated bipolar resistive switch of claim 1, wherein the S-NDR material comprises one or more of vanadium oxide, niobium oxide, titanium oxide and manganese oxide.

5. The heat mitigated bipolar resistive switch of claim 1, wherein the BRS matrix comprises a transition metal oxide (TMO) selected from a group consisting of tantalum oxide, hafnium oxide and titanium oxide.

6. A bipolar resistive switch heat mitigation system comprising:
one or both of a parallel-connected negative differential resistance (NDR) current limiter and a thermal limiter, the parallel-connected NDR current limiter to limit a switching current flowing in a bipolar resistive switch by the shunting current, the thermal limiter to remove heat generated in the bipolar resistive switch,
wherein the parallel-connected NDR current limiter and the thermal limiter are to mitigate an effect of heat at a temperature in the bipolar resistive switch above a predetermined elevated temperature, the heat mitigation to facilitate a predominance of a bipolar switching characteristic over a unipolar switching characteristic of the bipolar resistive switch,
wherein the parallel-connected NDR current limiter comprises an S-NDR element connected in parallel with a conduction channel in the bipolar resistive switch, the S-NDR element comprising an S-NDR material.

7. The bipolar resistive switch heat mitigation system of claim 6, wherein the S-NDR material comprises one or more of vanadium oxide, niobium oxide, titanium oxide and manganese oxide.

8. The bipolar resistive switch heat mitigation system of claim 6, wherein the thermal limiter comprises a high thermally conductive material to provide thermal conduction of the generated heat away from a conduction channel of the bipolar resistive switch.

9. The bipolar resistive switch heat mitigation system of claim 6, wherein the high thermally conductive material comprises a material selected from alumina, aluminum nitride, beryllia, diamond, silicon carbide, and boron nitride.

10. The bipolar resistive switch heat mitigation system of claim 6, further comprising the bipolar resistive switch comprising:
a first electrode and a second electrode; and
a bipolar resistive switching (BRS) matrix sandwiched between the first and second electrodes, the BRS matrix to support bipolar switching of a conduction channel formed between the first electrode and the second electrode through BRS matrix,
wherein the bipolar resistive switch is to provide bipolar switching between a pair of conduction states.

11. The bipolar resistive switch heat mitigation system of claim 10, wherein the BRS matrix comprises a transition metal oxide (TMO) selected from a group consisting of tantalum oxide, hafnium oxide and titanium oxide.

12. A method of heat mitigation in bipolar resistive switching, the method comprising:
switching a bipolar resistive switch between a first resistive state and a second resistive state; and
one or both of limiting current flowing through the bipolar resistive switch using a negative differential resistance (NDR) connected in parallel with a conduction channel that supports the flowing current and conducting away heat generated by the bipolar resistive switch using a material having high thermal conductivity in contact with the bipolar resistive switch,
wherein limiting current and conducting away heat are performed as a function of temperature above a predetermined elevated temperature of the bipolar resistive switch, and
wherein the NDR is provided by an S-NDR element connected in parallel with the conduction path of the bipolar resistive switch, limiting current flowing through the bipolar resistive switch comprising shunting current away from the conduction path using the parallel-connected S-NDR element, and wherein one or both of an interlayer dielectric layer adjacent to a bipolar resistive switching (BRS) matrix of the bipolar resistive switch and a substrate that supports the bipolar resistive switch comprises the high thermally conductive material.

* * * * *